United States Patent
Kodali et al.

(10) Patent No.: US 10,275,548 B1
(45) Date of Patent: Apr. 30, 2019

(54) INTERACTIVE DIAGNOSTIC MODELING EVALUATOR

(71) Applicant: The United States of America, as represented by the Administrator of the National Aeronautics & Space Administration (NASA), Washington, DC (US)

(72) Inventors: Anuradha Kodali, Sunnyvale, CA (US); Peter I. Robinson, Palo Alto, CA (US)

(73) Assignee: The United States of America as Represented by the Administrator of the NASA, Washington, DC (US)

( * ) Notice: Subject to any disclaimer, the term of this patent is extended or adjusted under 35 U.S.C. 154(b) by 628 days.

(21) Appl. No.: 14/877,584

(22) Filed: Oct. 7, 2015

Related U.S. Application Data

(60) Provisional application No. 62/062,504, filed on Oct. 10, 2014, provisional application No. 62/213,048, filed on Sep. 1, 2015.

(51) Int. Cl.
*G06F 17/50* (2006.01)

(52) U.S. Cl.
CPC ............... *G06F 17/5009* (2013.01)

(58) Field of Classification Search
None
See application file for complete search history.

(56) References Cited

PUBLICATIONS

Bickson et al. "Fault Identification via Non-parametric Belief Propagation", 2011, IEEE Transaction on Signal Processing, 12 pages.*
Rozaki, Eleni. "Network Fault Diagnosis Using Data Mining Classifiers", 2015, pp. 29-40.*
Puig et al. "A New Fault Diagnosis Algorithm that Improves the Integration of Fault Detection and Isolation", 2005, 44$^{th}$ IEEE Conference on Decision and Control, pp. 3809-3814.*
Kodali, A. et al., "Coupled factorial hidden Markov models (CFHMM) for diagnosing multiple coupled faults," IEEE Trans. Syst., Man, Cyber. A, Feb. 1, 2013, 43(3):522-534.
Kodali, A. et al., "Dynamic set-covering for real-time multiple fault diagnosis with delayed test outcomes," IEEE Trans. Syst., Man, Cyber. A, Sep. 12, 2012, 43(3):547-562.
Kodali, A et al. "A framework to debug diagnostic matrices," Annual Conference of the Prognostics and Health Management Society, Oct. 14, 2013, New Orleans, Louisiana.

(Continued)

*Primary Examiner* — Suzanne Lo
(74) *Attorney, Agent, or Firm* — Rhys W. Cheung; Robert M. Padilla; Mark P. Dvorscak

(57) ABSTRACT

Interactive diagnostic modeling evaluator (i-DME) for repairing a diagnostic matrix of a system. The diagnostic modeling evaluator cause steps to be performed comprising: evaluating a first diagnostic performance of a diagnostic unit using supervised data that includes one or more instances of a fault of a system; proposing a repair to the diagnostic unit based on the evaluated diagnostic performance; evaluating a second diagnostic performance of the diagnostic unit having the proposed repair; and upon determining that the second diagnostic performance meets a performance metric criterion, repairing the diagnostic unit according to the proposed repair.

23 Claims, 5 Drawing Sheets

(56) References Cited

PUBLICATIONS

Luo, J. et al., "An integrated diagnostic development process for automotive engine control systems," IEEE Trans. Syst., Man, Cybern. C, Nov. 2007, 37(6):1163-1173.
Singh, S. et al., "Dynamic multiple fault diagnosis: Mathematical formulations and solution technique," IEEE Trans. Syst., Man, Cybern, A., Jan. 2009, 39(1)1 60-176.
Strasser, S. et al., "Graph-based ontology-guided data mining for D-matrix model maturation," IEEE Aerospace Conference, Mar. 5, 2011, Big Sky, Montana.
Zhang, J. et al., "A dependency matrix based framework for QoS diagnosis in SOA," IEEE International Conference on Service-Oriented Computing and Applications, Jan. 14, 2009.
Kodali, A. et al, "Towards accreditation of diagnostic models for improved performance," Annual Conference of the Prognostics and Health Management Society, Sep. 2, 2014.

* cited by examiner

202

```
1. function iDME_algorithm (FDIR_requirements, failure_cases, system_model, configuration, wrappers, dmatrix,
2.                          diagnostic_algorithms, repair_strategies)
3.   dmatrix <- dmatrix | compute_dmatrix(system_model, configuration)
4.   FDIR_requirements_met <- unknown
5.   loop until FDIR_requirements_met = true
6.     suggested_repairs <- null
7.     diagnostic_measures <- determine_diagnostic_measures(performance_metrics, dmatrix, test_logic, fault_causes)
8.     for each repair_strategy in repair_strategies
9.         candidate_repairs_per_strategy <- determine_candidate_repairs(repair_strategy, diagnostic_measures)
10.        suggested_repairs <- candidate_repairs_per_strategy + suggested_repairs
11.    end loop repair_strategies
12.    for each suggested_repair in suggested_repairs
13.       test_logic <- repair_test_logic(suggested_repair)
14.       dmatrix <- repair_dmatrix(suggested_repair)
15.       diagnostic_measures <- determine_diagnostic_measures(performance_metrics, dmatrix, test_logic, fault_causes)
16.       suggested_repair_measures <- f(suggested_repair, diagnostic_measures) + suggested_repair_measures
17.    end loop suggested_repairs
18.    diagnostic_measures <- determine_diagnostic_measures(performance_metrics, dmatrix, test_logic, fault_causes)
17.    if diagnostic_measures not ok then
18.       for each suggested_repair_measure in suggested_repair_measures
19.          if not_acceptable(suggested_repair_measure) then
20.             test_logic <- undo_repair_test_logic(suggested_repair_measure)
21.             dmatrix <- undo_repair_dmatrix(suggested_repair_measure)
22.          end if
23.       end loop suggested_repair_measures
24.    end if
25.    system_model <- repair_system_model (dmatrix)
27.    dmatrix_from_system_model <- TEAMS(system_model)
28.    FDIR_Requirements_met = dmatrix_residual_acceptable(dmatrix, dmatrix_from_system_model) && diagnostic_measures
 = ok
29.  end loop FDIR_Requirements_met
30. end function 31. function determine_diagnostic_measures(performance_metrics, diagnostic_algorithms, test_logic, fault_causes)
32.    for each fault_case in fault_cases
33.     for each instance in time_steps(fault_case)
34.      data <- data(instance)
35.         supervised_description <- supervised_data(data, time_step)
36.       diagnostic_measures <- compute_diagnostic_measures(data, supervised_description, fault_case,
diagnostic_measures)
37.      end loop time_steps
38.     end loop fault_cases
39.    return diagnostic_measures
40. end function
```

FIG. 2

INTERACTIVE DIAGNOSTIC MODELING EVALUATOR

CROSS REFERENCE TO RELATED APPLICATIONS

This application claims priority of U.S. Provisional Applications No. 62/062,504 filed on Oct. 10, 2014 and No. 62/213,048 filed on Sep. 1, 2015, which are all hereby incorporated by reference in their entirety.

ORIGIN OF THE INVENTION

The invention described herein was made in performance of the work under a NASA contract and by an employee of the United States Government and is subject to the provisions of 51 U.S.C. § 20135(b), Public law 111-314, § 3 (124 Stat. 3330, 51 U.S.C. Chapter 201), and may be manufactured and used by or for the Government for governmental purposes without the payment of any royalties thereon or therefore.

BACKGROUND OF THE INVENTION

A. Technical Field

The present invention relates to assurance of safety and functionality of a system, and more particularly, to systems and methods for interactively evaluating diagnostic modeling of a system

B. Description of the Prior Art

To avoid failure modes of a system during operation, it is important to develop diagnostics for detecting, isolating and recovering faults of the system. For instance, during space missions, the fault detection, isolation, and recovery (FDIR) plays an important role in assuring safety and functionality to thereby reduce the probability of loss of crew (LOC), loss of mission (LOM), loss of vehicle (LOV), and loss of function (LOF). FDIR needs to be accredited to ensure acceptable false positive and false negative detection and isolation rates. When the false positives or false negatives rates are too high, one of the key challenges is to analyze and repair the diagnostic system models in a timely manner.

Typically, the conventional diagnostics are performed manually in the following way: List failure root causes (faults)→Design tests→Build a diagnostic system model (construct fault propagation paths between faults and tests)→Generate D-matrix (for relevant system mode)→Diagnose via inference algorithm. In this conventional approach, the faults to be isolated in the sub-systems are listed, and then the tests required to isolate these faults are designed. Then, the diagnostic system model is developed as a schematic from which the relationship between the faults and tests is established in the form of D-matrix entries (or, equivalently, diagnostic matrix, fault signature matrix, or reachability matrix). Finally, an algorithm is implemented to isolate the faults based on the observed test outcomes in real-time.

In the conventional approach, the diagnostic system model doesn't guarantee high performance during diagnostics. Also, there is no automated mechanism to actually verify the accuracy of diagnostic process at each step. In addition, sometimes, human modelers themselves may retrospect and try to correct their models by manually visualizing failure mode propagation paths to suit the diagnostic performance requirements when their analysis is not as expected. But, this manual procedure becomes infeasible for large-scale systems and also, when the datasets are very large with numerous numbers of sensors, human modelers are incapable to process the corresponding information manually. Typically, the human modelers capture the failure effects of a large set of failure mode effect analysis (FMEA) numbering into thousands for a typical NASA system. At some point, when the size of the failure space (n) grows, the modeling process becomes beyond human comprehension as modelers must consider not just how to model each failure mode individually but also all the potential interactions with other failure modes. Hence, in a worst-case, the engineers must handle the complexity of n! potential number of faults interactions. In addition, the human diagnostic system modelers may ignore the lag and noise that show up during operation because they don't tend to build the diagnostic system model from data streams which can number in the hundreds, if not thousands, of data stream signals as well.

The formal measures of system performance are defined through diagnostic utility measures which characterize the false positive/false negative performance for detection and isolation (two key portions of FDIR). However, as new failure modes are progressively added to the diagnostic system model one at a time, it is very hard to consider diagnostic utility in a global way while developing the diagnostic system model. Sometimes, even small changes to the diagnostic models may tend to cause unexpected problems to the already established failure modes and its propagation mechanism, especially when additional failure modes coexist. Thus, it is very difficult to lower global false positive/negative isolation rates, especially when there is no technical mechanism that can reexamine and correct the diagnostic system model in a global, automated fashion.

There are several attempts to retrospect and change the diagnostic system models to thereby improve performance. But these attempts are not unified in their approaches. For instance, one approach proposes to identify only new dependencies or correct erroneous ones in the existing diagnostic model using the historical maintenance data. Another approach modifies the dependency model by removing the irrelevant links owing to practical considerations and thus, reducing missed detections in fault diagnosis. Thus, the existing approaches either do not consider retrospection of diagnostic system models or else propose to do it without considering all the requirements to make the model sophisticated and full proof. The main reason is that the historical methods tend to not be systematic in considering the required system modes and failure conditions under which the diagnostic system models are required to perform.

Thus, in order to assure safety and functionality of the FDIR system, there is a need for a tool for aiding the human modelers in debugging/repairing the diagnostic system model and D-matrix when FDIR results are incorrect.

SUMMARY OF THE INVENTION

In one aspect of the present invention, a diagnostic modeling evaluator for iteratively repairing a diagnostic unit that includes at least one diagnostic matrix of a system causing steps to be performed on each iteration until diagnostic performance is met or maximum performance is determined. Each iteration comprises a set of steps. The first step of the diagnostic unit is to compute the diagnostic performance using supervised data that includes one or more instances of a fault of a system (also could nominal data as well). The second step of the diagnostic unit is to propose a set of repair(s) to the diagnostic unit based on the evaluated diagnostic performance(s) is defined. The third step of the diagnostic unit is to re-evaluate the diagnostic measures with the proposed repairs and upon determining that the results of the third step, namely the second diagnostic performance(s) meets the performance metric criteria, perform repair of the diagnostic unit according to the proposed repair. If the diagnostic performance measures do not meet the performance metric criteria, then continue to iterate.

In one aspect of the present invention, a computer-implemented method for repairing a diagnostic unit having a diagnostic matrix of a system includes: calculating diagnostic measures for detecting and isolating faults in supervised data of the system, the supervised data including one or more instances of the faults; repairing the diagnostic unit based on the calculated diagnostic measures; evaluating diagnostic performance of the repaired diagnostic unit; and, upon determining that the diagnostic performance meets a performance metric criteria, replacing the diagnostic unit before repair with the repaired diagnostic unit.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. The embodiments are shown in a top-down hierarchical manner.

FIG. 2 shows an exemplary pseudo code for an i-DME process according to one embodiment of the present invention.

DETAILED DESCRIPTION OF THE INVENTION

Figure 1:
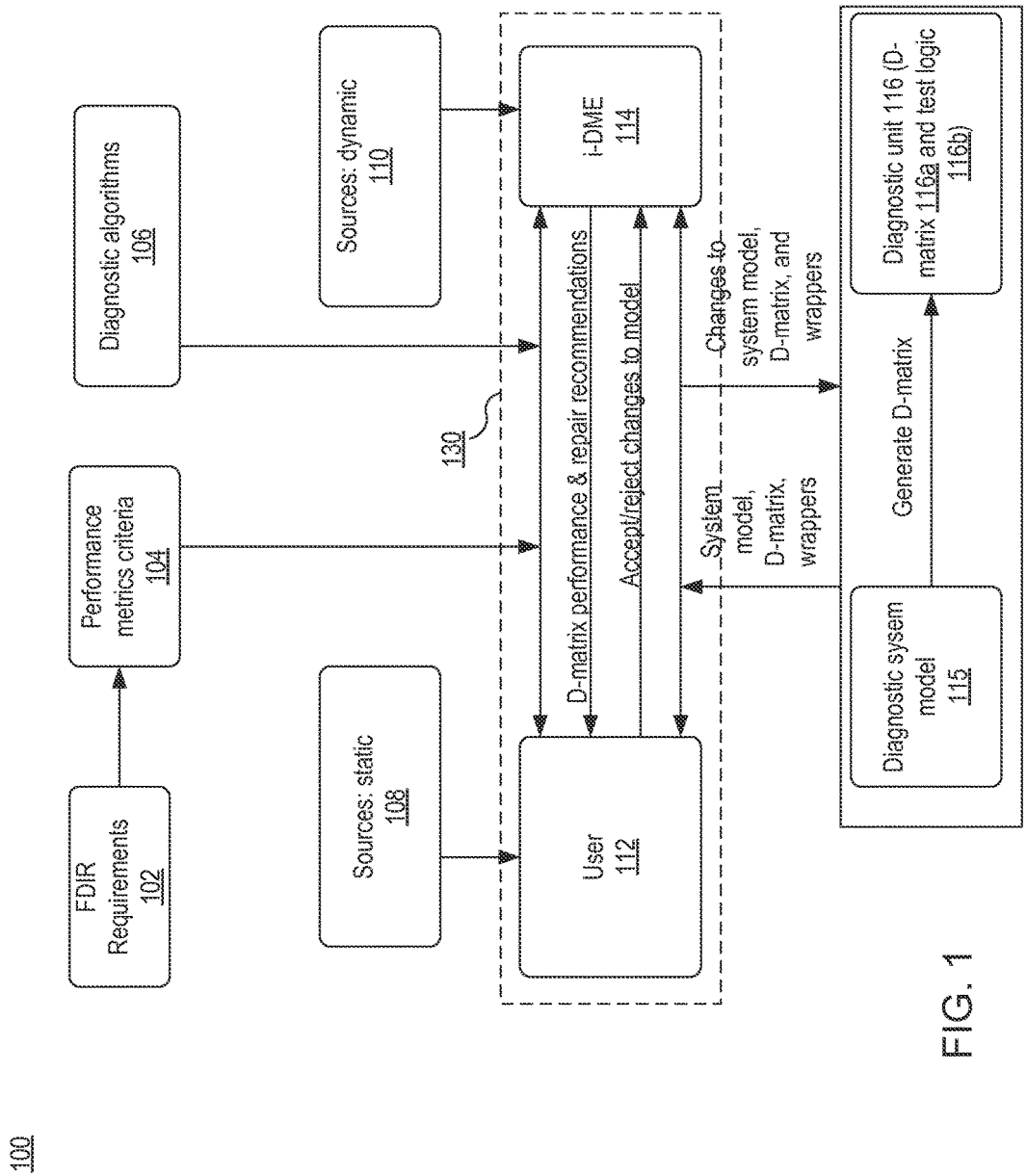
FIG. 1 shows an operational diagram which captures the high-level information of an interactive diagnostic modeling evaluator (i-DME) process according to one embodiment of the present invention.

In the following description, for the purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

A reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components in the figures are not restricted to connections that are effected directly. Instead, connections illustrated in the figures between components may be modified or otherwise changed through the addition thereto of intermediary components, without departing from the teachings of the present invention.

Furthermore, one skilled in the art shall recognize: (1) that certain steps may optionally be performed; (2) that steps may not be limited to the specific order set forth herein; and (3) that certain steps may be performed in different orders, including being done contemporaneously.

In one embodiment of the present invention, a tool, which is named as interactive diagnostic modeling evaluator (i-DME), is proposed as a computer-user iterative interactive methodology that repairs the system model through its abstract representation (i.e. diagnostic matrix (D-matrix).

In embodiments, the diagnostic system model is a schematic representation of faults, tests, and their relationship in terms diagnostic system model constructs (e.g. nodes and arcs). In embodiments, the D-matrix may be derived from the diagnostic system model propagation paths as a relationship between faults and tests. In embodiments, in order to iteratively repair the D-matrix and test logic (or, equivalently wrapper code, hereinafter) by playing back a sequence of nominal and failure scenarios (given), the user may set the performance criteria (as provided by the customer) and accept/decline/accept provisionally the proposed repairs. During the D-matrix repair process, the iterative procedure of an embodiment includes conditions ranging from modifying 0's and 1's in the D-matrix, adding/removing the rows (failure sources) and/or columns (tests) of the D-matrix, or modifying test logic used to determine test results.

The user may play a critical role to determine if the repair strategies to D-matrix are in accordance with their set performance measures (function of requirements, efficacy, and cost from customer) and choose them accordingly. It may be the case that one repair negatively affects one part of the model while improving other aspects of the model. Hence the human plays a large role in ensuring that a Pareto-optimal set of repairs is performed. In addition to supporting the modifications, i-DME can provide a trace for each modification such that a rational basis for each decision can be understood.

An objective of an embodiment of the present invention is to simultaneously quantify diagnostic utility of system models (wrt to a set of performance metrics) and correct them with the supervised identification of simulations or operations information (dynamic data source), thereby increasing the fidelity of the FDIR system as well as decreasing the time and costs required to create the system model.

The i-DME process in FIGS. 1-5 is an automated process that is proposed to certify the diagnostic system model for all of the FDIR diagnostic performance requirements. Automation is performed through a sequence of progressively greater capabilities. The five capabilities are: (1) playback of data, (2) determination of detection and isolation, (3) guided repair of D-matrix, and (5) guided repair of system model.

Extending the conventional approach to develop the diagnostic system model and D-matrix, the i-DME process in FIGS. 1-5 provides the following tool innovations to the development of the fault detection, isolation, and recovery (FDIR) system in order to support humans for diagnostics tasks which are currently beyond human comprehension. The breakdown of support for human development of diagnostic systems is layered in terms of capabilities. Capability 1: Playback of large datasets with numerous sensors, which also include noise and lag. Capability 2: Capability 1+detection and isolation of "interesting" portions of the time series data. Capability 3: Capability 2+D_matrix repair suggestions guided with FDIR performance measures. Capability 4: Capability 3+System model repair suggestions. The four capabilities allow (1) the human modelers to correct their models without manually envisioning faults/failure propagation paths to suit the diagnostic performance requirements. It allows (2) the human modeler to pick appropriate time intervals in large datasets, as it is a time consuming task to be scroll through vast amounts of data to identify interesting time windows. It allows (3) the human modelers to modify/develop D-matrix and diagnostic system model for large-scale systems where the datasets for the process are very large with numerous numbers of sensors and human modelers are incapable to process the corresponding information manually. In allows (4) the human modelers to consider diagnostic utility in a global way while developing the diagnostic system model. It allows (5) the human modelers to consider retrospection of diagnostic system models and propose to do it considering all the requirements to make the model sophisticated and full proof.

The advantage of i-DME process in FIGS. 1-5 is that it is a computer-guided unified process that aims to improve diagnostic performance of system model and avoid brute force computability required by the human for large failure space analysis. Also, it includes the user's expertise to check and balance the analysis from the computer. Practically, this tool provides an environment where the model parameters are simplified to be understandable and verified by the user and thus results in cost-effective modeling process.

It is noted that, in FIGS. 1-5, the i-DME process is applied to a multiple-fault, single configuration diagnostic system having the full complement of system model constructs (e.g. for the TEAMS diagnostic tool, the full complement of model constructs includes: components, connections, switches, logic gates (AND nodes), labels and signals. However, it should be apparent to those of ordinary skill in the art that the i-DME process in FIGS. 1-5 can be applied to multiple faults and multiple configuration diagnostic systems as well.

FIG. 1 shows an operational diagram 100 of an interactive diagnostic modeling evaluator (i-DME) process according to one embodiment of the present invention. As depicted, a set of FDIR performance requirements (or, shortly FDIR requirements) 102 for a system is determined/provided and used to derive/define the performance metrics criteria 104.

Performance metrics criteria 104, which is derived from the FDIR requirements 102, may be functions of diagnostic performance, mission requirements and costs involved. Performance metrics criteria 104 may be set by the user and can be defined by mathematical functions for various quantities, such as overall diagnostic efficiency, diagnostic time and cost (for both detection and isolation) as well as false-positive/false-negative rates for both fault detection and isolation. Given time series data from dynamics sources 110, i-DME 114 calculates various diagnostic performance measures of the D-matrix and compares the calculated measures to the performance metrics criteria 104. Then, based on the comparison, the D-matrix 116a and the test logic 116b may be repaired.

The diagnostic algorithm (which is also referred to as the inference algorithm) 106 may perform the standard diagnostic procedures based on D-matrix and be implemented as a diagnoser software in the i-DME process. Diagnostic algorithm 106 define the diagnostic algorithms required by the customer. For instance, the diagnostic algorithm 106 performs isolation analysis of the data corresponding to the system model. Thus, the diagnostic algorithm 106 aids in calculating the mathematical results, such as detection and isolation measures, that are used to analyze the system performance. The diagnostic algorithm 106 may include dynamic multiple fault diagnosis (DMFD) algorithms that are based on a primal-dual optimization framework and can detect multiple delays and intermittent faults over time. For instance, a DMFD algorithm is disclosed in a technical paper, authored by S. Singh, A. Kodali, K. Pattipati, S. Namburu, S. Chigusa, D. V. Prokhorov, and L. Qiao, entitled "Dynamic multiple fault diagnosis: Mathematical formulations an solution techniques," IEEE Sm C, Part A, Systems and Humans, Vol. 39, No. 1, January 2009. In embodiments, the performance metrics criteria 104 may be calculated after analyzing with the diagnostic algorithm 106.

The static sources 108 include, but are not limited to, physical model, historical field failure data, service documents, spreadsheets, engineering schematics, Failure mode, effects and criticality analysis (FMECA) data, sensor/commands list, operations timeline, and maintenance/operational simulations data. In embodiments, the static sources 108 include data that changes slowly over time if at all. The static sources 108 may be provided to the user 112. Most of these products are products of the design through the systems engineering process. Hence as the systems engineering process progresses through the system engineering phases of conceptualization, design, development, manufacturing, testing and operation these products will become more mature. Hence, the static sources 108 are not strictly speaking "static" over the lifecycle of the products, but with regard to the inputs of i-DME, they can be considered static.

The dynamic sources 110 include data sets that correspond to each of the faults in the D-matrix (or, may represent multiple faults) required to check the verification requirements of the FDIR requirements 102. The total set of dynamic data sources should include all of the classes of failures that the customer requires the system to detect and isolate. The dynamic sources 110 is referred to as supervised data because the data will be labeled with nominal or corresponding fault behavior. As more supervised data corresponding to all failure and nominal conditions is collected over time, it will provide additional failures cases to ensure the consistency of the D-matrix 116a and its corresponding system model 115 as well as to test the performance of the test logic 116b and diagnostic algorithms 106. In embodiments, the dynamic sources 110 includes pattern/instance, multiple traces of output signals from various sensors measured and collected over a time interval during real-time operations, simulations, or maintenance. Each dynamic source data file is made up of an ordered sequence of time point instances of output signals from a set of measurements over a preset time period. Each data point instance has at least two attributes: a measurement and the time when the value of the quantity is obtained. Often measurements correspond to physical sensor readings, but they can also include derived parameters which are inferred through models. In addition, the dynamic sources 110 may have noise and lag in measurements. Noise and lag are inherent properties due to the natural delay and noise of physical processes. They may also be affected due to the continuous degradation (wear and tear) of sensors and components over time. There are other sources of dynamic data which have not been enumerated.

During the i-DME process, the dynamic sources 110 can be processed either in batch or continuous mode. In the continuous mode, repairs are proposed independently for each batch of data processed by the i-DME 114 and proposed to modify the D-matrix 116a and/or test logic 116b. But, in the batch mode, the repairs are proposed immediately after every batch of data and the corresponding repairs are made on the system model. The batch processing is a key element to perform model regression in similar manner that software code regression is performed.

The diagnostic system model 115 may be developed from one or more sources in any suitable modeling paradigm. In one embodiment, it is constructed as a directed graph of nodes and arcs using TEAMS system model constructs (TEAMS Designer® software developed by Qualtech Systems Inc.) The nodes correspond to TEAMS constructs: modules, switches, testpoints, tests, labels, and AND nodes. The arcs correspond to TEAMS constructs: links. In this embodiment, the nodes represent the faults and tests and the arcs represent the propagation paths or links between the nodes. The switches, logic gates and labels help determine which portions of the model are active for a given system configuration. Additional embodiments with other diagnostic system modeling tools may use a different set of modeling primitives (e.g. system of equations, bond graphs) from which a mapping to Dmatrix can be described.

The diagnostic unit 116 includes a D-matrix 116a and a test logic 116b. As depicted in FIG. 1, the D-matrix 116a may be generated from diagnostic system model 115 by gleaning fault-test relationships in terms of 0 (pass) and 1 (fail) either by hand or by automated software. The D-matrix 116a is an abstract representation of the diagnostic system model 115 for a given system mode configuration. The representation is abstract due to the fact that in the conversion from System Model to D-matrix the propagation paths (i.e., links) between the failure modes and the sensors/tests are removed. The directed graph is replaced with a two dimensional table where the rows defined the failures modes in the TEAMS model and the columns define the sensors/tests. Each element of the D-matrix represents a causal relationship between the fault (row) and the test (column). The values of each element can be (either "0" or "1"). "0" indicates that there is no causal relationship between the corresponding fault and test while "1" indicates that there is a causal relationship between the corresponding fault and test. A "0" can occur due to the fact that the corresponding test (column) does not have access to the sensor measurement (signal) corresponding to the fault (row) or else does not have enough logic to detect the failure condition. Similarly, "1" means that the sensor measurement (signal) corresponding to the failure mode is accessed by the corresponding test point and has enough logic to detect it. Generalizing to the whole table, it can be understood that all the "1"s in a row identify the tests which can implicate a given failure mode. In addition, all the "1"s in a column identify the failure modes which can be detected by a single test. By way of example, for a gas tank of a system, the failure mode (row) may be leakage of the gas in the tank and a test (column) may be measuring the level drop inside the tank using a level sensor. This simpler representation enables faster access to debugging compared to the original model. But most importantly, the D-matrix enables realtime diagnostics in order to provide timely diagnostic information during operation.

The test logic evaluation code (or, equivalently, wrapper code) 116b converts analog data into three-valued logic of Boolean results plus unknown (true, false or unknown) for use with the diagnostic algorithms. A test can evaluate to "unknown" when the necessary input data for the test logic is not available (e.g. a sensor goes out, telemetry is lost, or other methods of data corruption). Common conversion algorithms are dead-band detectors, threshold detection, trend detection, and other mathematical models. For instance, the output data from a thermometer includes a sequence of temperature readings over a time period and is input to the test code as dynamic sources 110. In embodiments, the dynamic data failure cases, during a time interval the output signals from sensors, will exhibit the effects of one or more failures. When the test logic 116b detects the effects of the failures, it annotates the time series data. Depending on the conversion algorithms, for each reading, the test code may determine whether the value is above a preset threshold. If the reading is above the threshold, the test code outputs "1." Otherwise, the test code outputs "0" for the reading. The use of three-valued logic for test results directly supports failure isolation as the diagnostic algorithms are flexible and handle unknown test results naturally by will widening their isolation ambiguity groups due to their ability to handle unknown test results The initial role of the user 112 is to develop the diagnostic system model 115 from the static sources 108, such as CAD, schematics, safety products (FMEA, Hazards, PRA, other), IPCL (sensors, commands, measurement list), ICDs, logistics information (LRU—Line Replaceable Units, ORU—Orbital Replaceable Units), other. The user 112 may also provide the i-DME 114 with the required inputs like the supervised annotations of the dynamic sources 110 and performance metrics criteria 104. Also, the user 112 accepts/declines the proposed repairs at every iteration with their technical expertise. In some embodiments, when more than one repair is proposed and they are counter explanative, the user 112 may choose one or more of the proposed repairs to perform thereby improving the user-set performance. Or the user can choose to not make the changes as in some embodiments, improvement in one metric can adversely affect others. The user/customer can also accept solutions which are Pareto-optimal (e.g. all metrics degraded but acceptable). In other cases, priority may be given only to a subset of metrics. For example since one cannot add more sensors—there will always be a minimum FP/FN detection/isolation rate—even if the required rate was lower. Users can perform this type of reasoning due to the fact that users can reason outside of the boundaries defined by i-DME hence can consider system realities which are not formalized such as modeling assumptions and fidelity of static and dynamics sources.

i-DME 114 may be defined as a computer process that provides the user with a platform for analyzing the system model using the dynamic supervised data sources 110. In embodiments, the user 112 performs the role of accepting/declining/conditionally accepting repairs based on the analysis and technical expertise and assessing the correctness. In FIG. 1, the item 130 includes the feedback control process between the user and the iDME system. The user and tool also play a key role of identifying the time windows of applicability.

FIG. 2 shows an exemplary pseudo code 202 for an i-DME process according to one embodiment of the present invention. Each line in 202 is prefixed with a line number. As depicted, the process 202 shows the steps to iteratively repair the D-matrix 116a and System Model 115. Also, the i-DME 114 provides the performance information of the diagnostic unit and repair recommendations to the user 112. i-DME 114 receives its input data, the D-matrix 116a, test logic 116b and supervised data 110 at line numbers 1 and 2. In embodiments, the data is received in either a batch or a continuous mode. Then, the i-DME 114 evaluates diagnostic (isolability and detectability) performance of each test of each the fault case at line number 7. In embodiments, the diagnostic algorithm 106 may be used to evaluate the diagnostic performance for each combination of the test and the fault case at line number 7. The result defined at line number 7 is due to the pseudo-code defined by the function determine diagnostic measures in line numbers 31-40. Then, at line numbers 8-11, using the evaluated diagnostic performance, one or more of the five repair strategies may be proposed to determine a set of suggested repairs. At line numbers 12-17 for each proposed repair strategy, the i-DME 114 re-calculates diagnostic measures, i.e., i-DME calculates the diagnostic measures upon applying each proposed repair to the diagnostic unit. Upon completion of considering all of the suggested repair strategies, the i-DME 114 determines the performance of the diagnostic unit with all the new repairs at line number 18. The user analyzes the performance of the diagnostic unit including the proposed repairs to check if it meets the defined performance criteria. At line numbers 17-24, if the diagnostic measures are unacceptable the user can decline the repair and revert the test logic D-matrix back to prior state. Once all of the D-matrix and test logic repairs are made, the repairs can be propagated back to the system model (line numbers 25, 26). i-DME may continue to iterate (line number 5 and 29) until the FDIR_requirements are met. Determination that FDIR requirements are met is a function of both the diagnostic measures as well as residual between the repair D-matrix and the D-matrix produced from the system model (line number 28).

Figure 3:
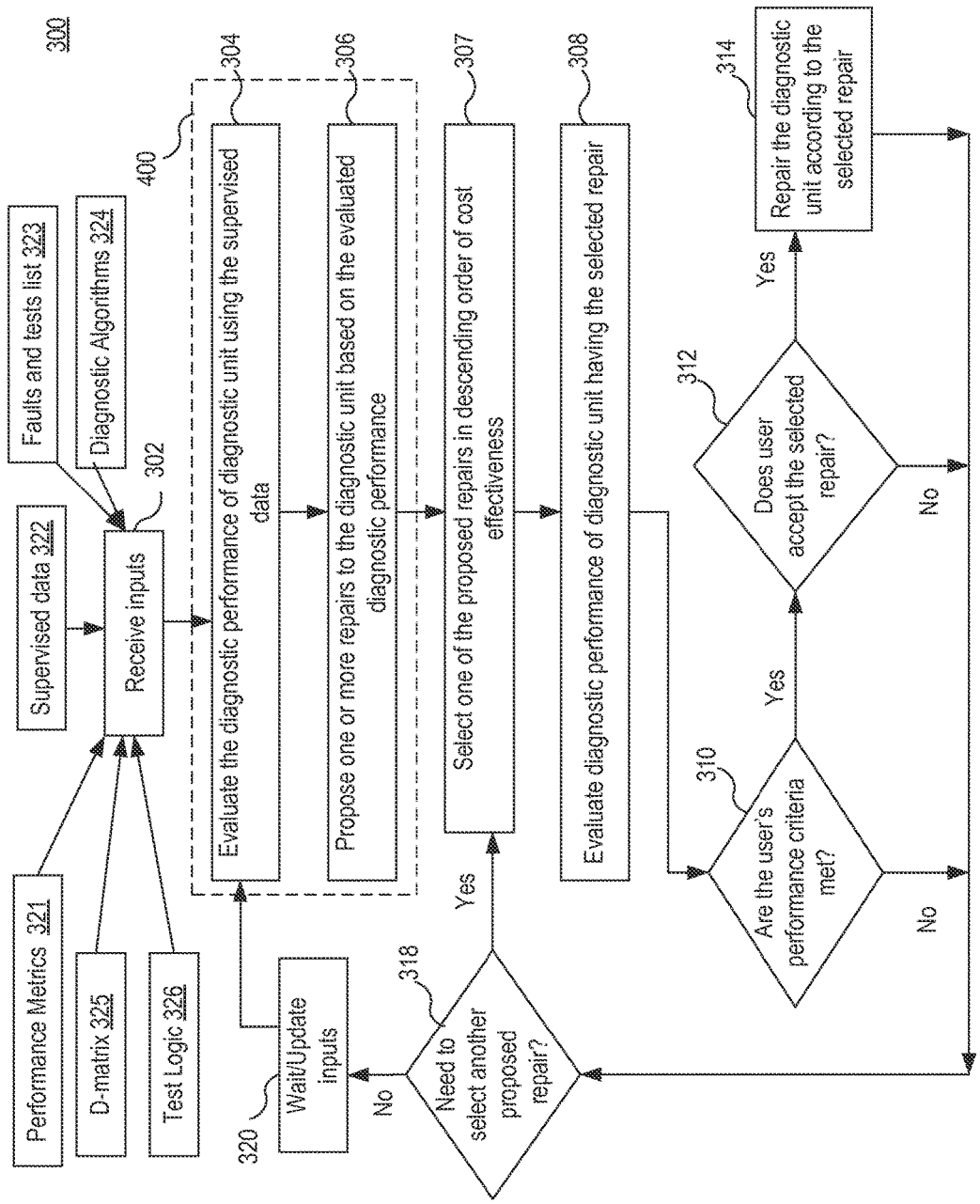
FIG. 3 shows an exemplary flowchart for repairing a D-matrix according to one embodiment of the present invention.

FIG. 3 shows an exemplary flowchart 300 for repairing the D-matrix 116a according to one embodiment of the present invention. The flowchart 300 describes the processes in the item 130 in FIG. 1 in detail. As depicted, the process 300 may start at step 302. At step 302, the i-DME 114 receives six inputs, including the Performance Metrics 321 (from 104), Supervised Data 322 (from 110), Diagnostic Algorithms 324 (from 106), D-matrix 325 (from 116a), Test Logic 326 (from 116b), and Faults/Tests list 323 (from 116a). In embodiments, the input data is passed to the i-DME 114 in a batch mode or a continuous mode. Then, the diagnostic algorithm 324 evaluates the five different diagnostic performance measures of the diagnostic unit at step 304. Subsequently, at step 306, the i-DME 114 proposes one or more five different repairs based on the evaluated diagnostic performance.

At step 307, i-DME selects one of the proposed repairs in the descending order of cost effectiveness, i.e., the i-DME selects one that costs the minimum amount to repair. It is key to understand the word repair can have several meanings with respect to i-DME: Meaning 1: repair of D-matrix, Meaning 2: repair of System Model and Meaning 3: physical repair of the modeled artifact (e.g. add sensors and/or add redundancy). Meaning 1 and 2 apply. Then, at step 308, the i-DME evaluates the diagnostic performance of the selected repair to the diagnostic unit. More specifically, the i-DME modifies the diagnostic unit 116 according to the selected repair and calculates the diagnostic measures for the modified diagnostic unit. This step is similar to the regression testing in the sense that the i-DME tests the modified diagnostic unit before it proceeds to the next step (with regard to all the prior repairs of the model). In embodiments, the diagnostic algorithm (inference algorithm) 324 is used to calculate the diagnostic measures at step 308.

At step 310, it is determined whether user's performance criteria are met through a comparison between calculated diagnostic measures and the corresponding performance metrics 321. If the performance criteria are met at 310 then at step 312, diagnostic unit 116 is repaired according to the selected repair at step 314 and the process proceeds to step 318. In some cases, it may be possible that a repair may change not only a targeted portion of the D-matrix, but also other unexpected portions of the D-matrix and the user must consider (balance) the targeted change as well as the unexpected changes that each repair brings about when they determines whether to accept or reject the repair. If the user rejects the repair, the process proceeds to step 318 in order to select another repair.

At step 318, the i-DME decides whether there is another repair to be selected. Upon positive answer to step 318, the process 300 proceeds to step 307 and repeats steps 307-314. Otherwise, the process 300 proceeds to step 320. At step 320, may wait for new data, such as supervised data 322, and repeats steps 304-318 when it receives new data.

Figure 4:
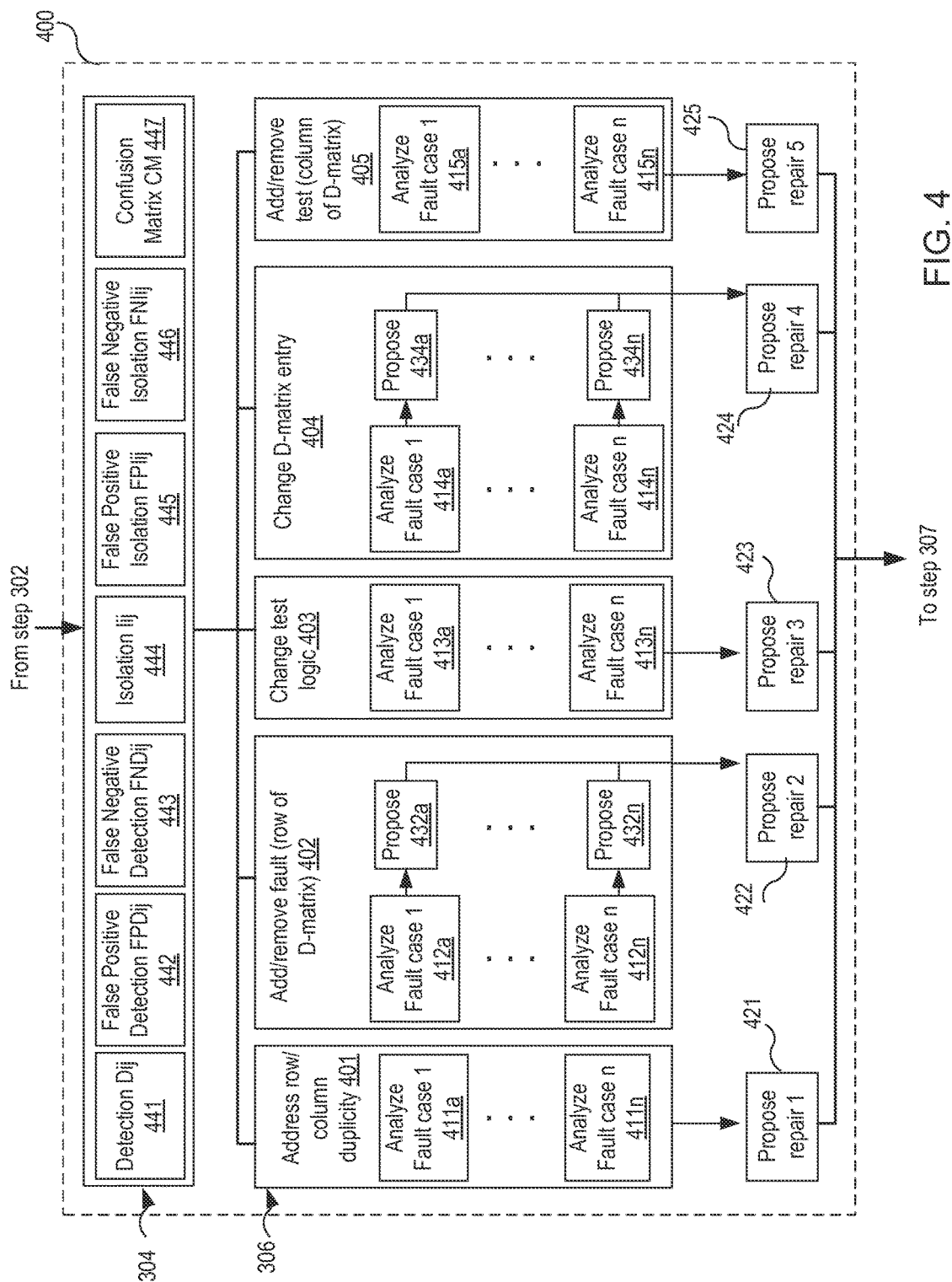
FIG. 4 shows an exemplary flowchart of steps in FIG. 3 according to another embodiment of the present invention.

FIG. 4 shows a flowchart 400 that corresponds to steps 304 and 306 in FIG. 3. In FIG. 4, steps 441-447 identify a set of seven diagnosis measures for detection, isolation and confusion. Detection measures define how well a test detects the failure condition of the fault are defined: Dij: Detection Measure Matrix 441, false positive detection measure: $FPD_{ij}$ 442, and false negative detection measure: $FND_{ij}$ 443. Isolation measures define how well a fault is isolated from other failures after the tests detect the fault: isolability measure $L$ 444, false positive isolation measure $FPI_i$ 445, false negative isolation measure $FNI_i$ 446. Confusion measures $CM_i$ 447 define how well each fault i (row) is isolated from all other faults as fault i. All measures are determined by evaluating diagnostic measure predicates at each time point instances of the supervised data files. The diagnostic measures are assumed to be low if they are less than a pre-defined threshold ratio, if one assumes the nominal case as an extra fault in D-matrix with all the corresponding entries "0" for convenience of the definition of these measures.

Diagnostic Measures: Detection Measures:

Each test corresponds to the logic from the test logic 116b. If the test can detect whenever a fault occurs, the corresponding entry in D-matrix is "1." Similarly, if the test cannot detect a fault, the corresponding D-matrix entry is "0." Both these conditions, defined as true positive (TP) and false positive (FN) detection measures should be true to calculate the correctly detected instances. Thus, ideally, if the test logic 116b is good, its outcome should match the D-matrix entry of that test corresponding to the fault. However, if the test logic 116b is not properly programmed (or the dynamic data is not useable, incorrect or incomplete (i.e. not all fault cases are covered), the output from the test logic 116b may not match the D-matrix. To determine the performance level of the test logic 116b for each test j and fault i, the diagnostic algorithm 106 keeps track of the detections measures annotated on the dynamic sources 110 by the test logic 116b, and generates a detection measure matrix (or, shortly detection measure) $D_{ij}$ 441, where the detection measure $D_{ij}$ of test j and fault i is defined as $$D_{ij} = \frac{\text{No. of correctly detected instances corresponding to fault } i \text{ by test } j}{\text{Total no. of instances corresponding to fault } i} \quad \text{Eq. (1)}$$

$D_{ij}$ can be calculated for supervised data having one or more instances corresponding to fault j, where "instances" identified in Eq. (1) corresponds to a time-stamped data point in a supervised dynamic data file. For each fault j, $D_{ij}$ is a ratio of numbers between the correctly detected portion of instances by the test i and the entire portion of instances in the supervised data. The detection measure may be partitioned into false positives and false negative terms. The false positive detection measure is defined only when the corresponding D-matrix entry of the fault and test is "0" and false negative detection measure is defined when the D-matrix entry is "1." The diagnostic algorithm 106 calculates false positive detection measure matrix (or, shortly false positive detection measure) $FPD_{ij}$ 442 of test j and fault i:

$$FPD_{ij} = \frac{\text{No. correctly detected instances corresponding to fault } i \text{ by test } j; \text{ when } D-\text{matrix}(i,j)=0}{\text{Total no. of instances corresponding to fault } i; \text{ when } D-\text{matrix}(i,j)=0} \quad \text{Eq. (2)}$$

Similarly, the diagnostic algorithm 106 calculates false negative detection measure matrix (or, shortly false negative detection measure) $FND_{ij}$ 443 of test j and fault i:

$$FND_{ij} = \frac{\text{No. of correctly detected instances corresponding to fault } i \text{ by test } j; \text{ when } D-\text{matrix}(i,j)=1}{\text{Total no. of instances corresponding to fault } i; \text{ when } D-\text{matrix}(i,j)=1} \quad \text{Eq. (3)}$$

Diagnostic Measures: Isolation Measures:

The isolability calculation considers the D-matrix as a whole with all the test points are taken into consideration and then isolates the probable fault with the aid of the diagnostic algorithm 106. Isolation measures are no longer binary but have to identify with the correct fault. If the fault is not isolated correctly, it is counted as an incorrect instance. The true fault information is available from the supervised data. For each fault case, there will be one corresponding isolability measure, where the isolability measure $I_i$ 444 for fault i is defined as:

$$I_i = \frac{\text{No. of correctly isolated instances corresponding to fault } i}{\text{Total no. of instances corresponding to fault } i} \quad \text{Eq. (4)}$$

In embodiments, $I_i$ can be calculated for supervised data having one or more instances corresponding to fault i. For each fault i, $I_i$ is a ratio of numbers between the correctly isolated portion of instances corresponding to fault i and the entire portion of instances in the supervised data. The isolability measures in terms of false negatives and false positives are defined when the fault i is not isolated correctly when it is supposed (wrt. supervised description) to and when the fault i is isolated when the true fault is different, respectively. False positive isolation measure $FPI_i$ 445 of fault I is defined as:

$$FPI_i = \frac{\text{No. of correctly detected instances as fault } i; \text{ when true fault} \neq i, \text{ or nominal}}{\text{Total no. of instances not corresponding to fault } i} \quad \text{Eq. (5)}$$

False negative detection measure of fault I is defined as $FNI_i$ 446:

$$FNI_i = \frac{\text{No. of correctly detected instances corresponding to fault } i; \text{ when true fault} = i}{\text{Total no. of instances corresponding to fault } i} \quad \text{Eq. (6)}$$

Diagnostic Measures: Confusion Matrix:

In addition to the measures in Eqs. (1)-(6), a confusion matrix CM 447 may be constructed, where rows and columns are similar to the faults (rows in D-matrix, including nominal case). The rows of the confusion matrix represent true faults and the columns represent isolated faults by the algorithm. The confusion matrix is constructed by noting how many instances of a fault i (row) are isolated as fault i or other faults not i (column). For example, if fault 1 in D-matrix is isolated as fault 3 always, the entry corresponding to fault 1 as row and fault 1 as column is 0 whereas the entry corresponding to fault 1 and fault 3 is total number of data points. This provides a system-level view. Requires running all the cases.

Once the diagnostic measures are derived, they provide the predicates to determine which of five different D-matrix repairs 401-405 are applicable to repair the D-matrix 116*a*. These repair strategies are enumerated in the descending order of cost-effectiveness (with regard to model costs and artifact costs). The five repair strategies which may be proposed during the i-DME process are: (1) address row/column duplicity 401; (2) add/remove a fault (i.e., add/remove a row of the D-matrix) 402; (3) change the test logic 403; (4) change D-matrix entry 404; and (5) add/remove a test (i.e., add/remove a column of the D-matrix) 405. In some embodiments, each repair may be proposed only after its predecessors in order to avoid analyzing the same problem of the diagnostic unit. In other embodiments, the five repair strategies may be proposed in a different order. For example, the adding rows strategy may precede the other strategies to avoid unnecessarily changing the test logic or D-matrix entries for multiple tests. In another example, changing a D-matrix entry may be done only after changing the test logic is experimented. The five repair strategies can be compared and contrasted with respect to a fixed set of dimensions. These dimensions are 1) why: the rationale for making the change—must be to improve detection and/or isolation capabilities, 2) where: the portions of the dmatrix which are modified, 3) when: the rationale on when in the iDME process the repair can be performed—either after analysis of each fault case or after analysis of all the fault cases, 4) cost:—the costs associated with the repair. 5) system model impact:—who the repair impacts the System Model will be addressed at a later time.

D-matrix Repair: Address row/column duplicity, 401. Why: In this repair strategy, faults/tests corresponding to rows and columns of D-matrix are assessed for duplicity in terms of two or more rows or columns having exactly the same signature. Where: duplicate faults/tests are grouped into one, the representation is simplified and computational complexity is decreased. When: In embodiments, the repair strategy 401 includes two steps: (1) analyze (i.e., identify) two or more rows/columns which have the same signatures at steps 411*a*-411*n*; and (2) propose to remove the duplicate faults/tests at step 421. The repair is only proposed after the loop analyses for all of the fault cases 411*a*-411*n*. This is due to the fact that all of the repairs need to be taken into consideration to determine matching. Hence, in embodiments the duplicate rows/columns of the D-matrix are not removed upfront to allow subsequent repair strategies in other iterations; instead, the user keeps the note of them. Also, when redundant sensors are critical, the duplicate rows/columns are not removed. Cost: Measurements are removed, unless the sensors are required for redundancy in critical situations.

D-matrix Repair: Add/remove a fault (i.e., add/remove a row of the D-matrix), 402. Why: The user may accept removing a row when there is no need of low-level fault modeling. On the other hand, the user may accept (otherwise, decline) adding a row when (1) more tests have low detectability measures only for the corresponding fault case; (2) there is enough evidence in terms of number of instances representing this new signature; and/or (3) the repair is in accordance with the fault modeling strategy of the system. Adding rows improves granularity of fault modeling and thus detection and isolation measures, while removing rows decrease computational complexity. A row is added when a part of data, but not all, corresponding to a fault is diagnosed as a different fault consistently (viewed from the confusion matrix). This implies false negative isolability measure is low. Isolability measures corresponding to the fault are low consistently for a part of the data. Detectability measures for most of the tests corresponding to the fault are low. Where: In this repair strategy, adding/removing a fault corresponds to modifying the fault modeling. A row is added when failure conditions of a component can have different severity levels based on their root-cause, resulting in different fault signatures in D-matrix. Conversely, when the fault modeling needs to be done at a higher level the subsequent lower level rows are removed from D-matrix. This is due to the need to either refine the fault description or abstract the fault description. The new (i.e., repaired) D-matrix row is considered as a different failure mode of the same component if the user asserts the correctness of fault label (information from the user). Otherwise, a new row is added as a row corresponding to a new fault which is unknown earlier. When: As depicted by steps 412[$a \ldots n$], 432[$a \ldots n$] and 422 in FIG. 4, add/remove a fault repair 402 is proposed independently for every fault case. Thus, it can be proposed at the end of every iteration of the fault case loop.

D-matrix Repair: Change test logic (wrapper code/logic) 403. This repair strategy includes changing the test logic in order to improve the detection capability of the test, and possibly improve the isolability of the faults in D-matrix: Why: When the detection performance is not satisfactory across all fault cases. When the detectability measures of a test across all faults is very low. When the overall detection improves considerably and/or only if the enhancement in false positive/false negative isolability measure is according to performance criteria that are set by the user. When: As depicted by steps 413[$a \ldots n$] and 423, this repair is proposed after the loop for all the fault cases because all the fault cases need to be analyzed for the overall detection performance of the test. Where: May shrink/expand threshold levels for higher false positive/false negative detectability measure. The user may propose new test logic, such as statistical, trending, machine-learning, or signal processing that can be experimented with.

Dmatrix Repair: Change a D-matrix entry, 404. The D-matrix entries are assessed for contributing to false positive/false negative isolation rates of each fault (row), and thus correcting them will improve the diagnostic performance. Why/Where: If the detectability measure of a test when analyzed on a fault is very low, this may lead to wrongly identifying the fault. D-matrix entries are changed from "0" to "1" when a given test (column) can contribute to exonerating or implicating a fault (row) or if false positive detectability measure of the test is low (false positive isolability measure of the fault is also low; can be viewed from the confusion matrix of true faults vs isolated). When a given test has no relationship to the fault or the test logic is insufficient to detect the fault because of the sensitivity of the failure condition or if false negative detectability measure of the test is low (false negative isolability measure of the fault is also low; can be viewed from the confusion matrix of true faults vs isolated) an entry of the D-matrix is changed from "1" to "0". When: As depicted by steps 414[$a \ldots n$], 434[$a \ldots n$] and 424, this repair may be proposed independently for each test point and every fault case. The user accepts this change to the D-matrix if the repair improves the diagnostic performance (detection, isolation) criteria.

Dmatrix Repair: Add/remove a test (change a column of D-matrix), 405. Why: A new test(s) is added if some faults are not adequately isolated, i.e., they are not isolable even when the detectability measures of the tests are higher. The user accepts adding a new test if the cost is not considered. If the cost is considered, the user trades the benefits between performance and cost. The user accepts removing a test when it affects the overall isolation capability (viewed via isolability measures and confusion matrix) or if the corresponding detectability measure is very low. Hence, low reliable and delayed tests hinder the overall diagnostic performance efficiency and may be removed when not detecting critical faults in any other system mode. This impacts the isolability measure of the corresponding faults too. The user declines removing a test if it is critical or used in other system modes (information from the user with a global perspective of the system). Where: In this repair strategy, a new test may be associated with a new sensor, or a new test with analyzing the existing sensor measurements with a different threshold or technique, or new tests associated with model derived parameters. When: When none of the above four repair strategies 401-404 can improve the performance metrics, the repair strategy 405 is applied to add a new test for improving isolability of certain faults. As depicted at steps 415 and 425, this repair is proposed after the loop analyses for all the fault cases because all of the fault cases need to be analyzed to determine the overall detection performance of the test. In embodiments, this repair strategy is selected last amongst the five strategies 401-405 because adding a new test incurs additional costs for a sensor(s) and computational complexity.

In embodiments, one or more computing system may be configured to perform one or more of the methods, functions, and/or operations presented herein. Systems that implement at least one or more of the methods, functions, and/or operations described herein may comprise an application or applications operating on at least one computing system. The computing system may comprise one or more computers and one or more databases. The computer system may be a single system, a distributed system, a cloud-based computer system, or a combination thereof.

It shall be noted that the present invention may be implemented in any instruction-execution/computing device or system capable of processing data, including, without limitation phones, laptop computers, desktop computers, and servers. The present invention may also be implemented into other computing devices and systems. Furthermore, aspects of the present invention may be implemented in a wide variety of ways including software (including firmware), hardware, or combinations thereof. For example, the functions to practice various aspects of the present invention may be performed by components that are implemented in a wide variety of ways including discrete logic components, one or more application specific integrated circuits (ASICs), and/or program-controlled processors. It shall be noted that the manner in which these items are implemented is not critical to the present invention.

Figure 5:
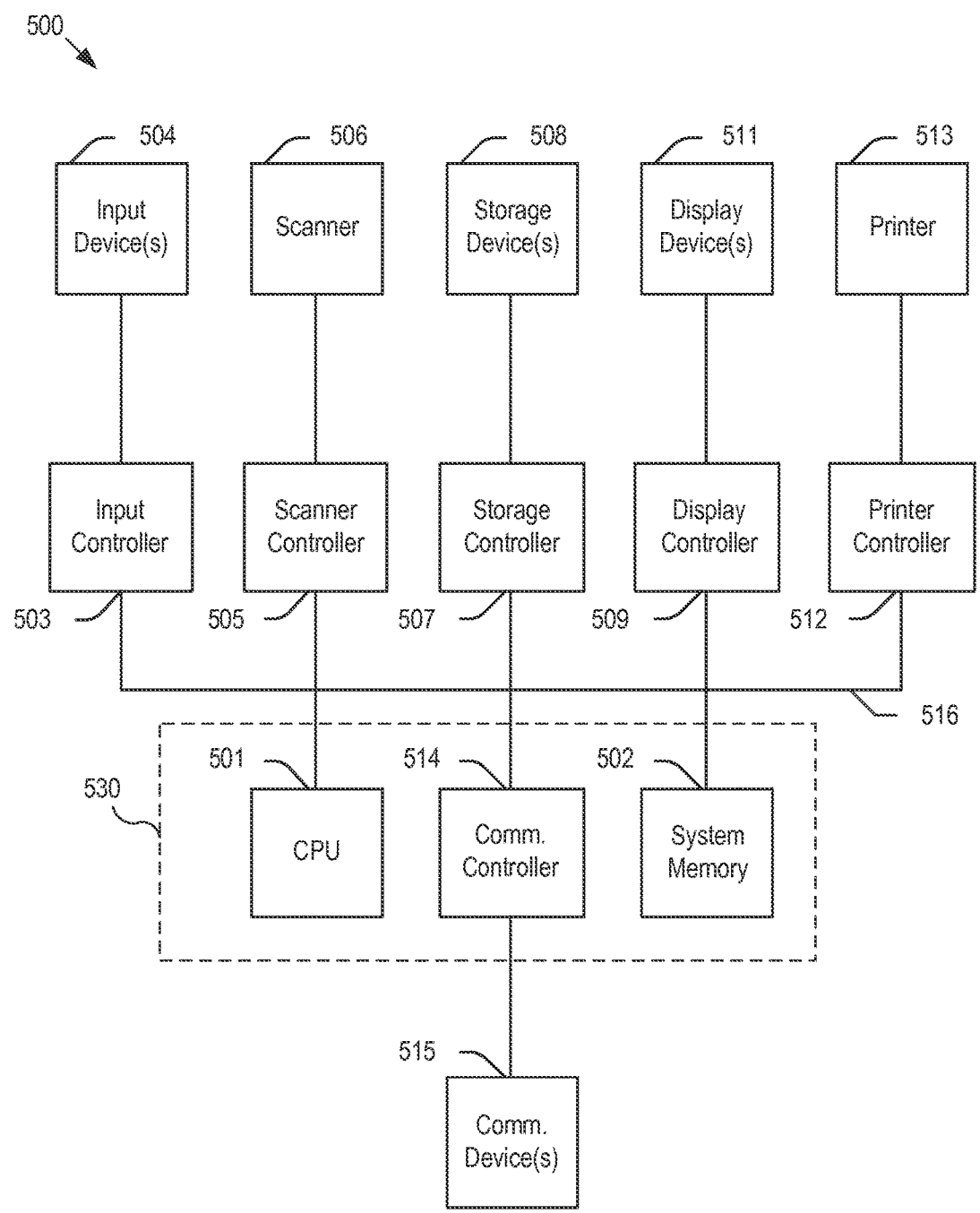
FIG. 5 shows a computer system according to embodiments of the present invention.

Having described the details of the invention, an exemplary system 500, which may be used to implement one or more aspects of the present invention, will now be described with reference to FIG. 5. Each element in FIG. 1 may include one or more components in the system 500. As illustrated in FIG. 5, system 500 includes a central processing unit (CPU) 501 that provides computing resources and controls the computer. CPU 501 may be implemented with a microprocessor or the like, and may also include a graphics processor and/or a floating point coprocessor for mathematical computations. System 500 may also include a system memory 502, which may be in the form of random-access memory (RAM) and read-only memory (ROM).

A number of controllers and peripheral devices may also be provided, as shown in FIG. 5. An input controller 503 represents an interface to various input device(s) 504, such as a keyboard, mouse, or stylus. There may also be a scanner controller 505, which communicates with a scanner 506. System 500 may also include a storage controller 507 for interfacing with one or more storage devices 508 each of which includes a storage medium such as magnetic tape or disk, or an optical medium that might be used to record programs of instructions for operating systems, utilities and applications which may include embodiments of programs that implement various aspects of the present invention. Storage device(s) 508 may also be used to store processed data or data to be processed in accordance with the invention. System 500 may also include a display controller 509 for providing an interface to a display device 511, which may be a cathode ray tube (CRT), a thin film transistor (TFT) display, or other type of display. System 500 may also include a printer controller 512 for communicating with a printer 513. A communications controller 514 may interface with one or more communication devices 515, which enables system 500 to connect to remote devices through any of a variety of networks including the Internet, an Ethernet cloud, an FCoE/DCB cloud, a local area network (LAN), a wide area network (WAN), a storage area network (SAN) or through any suitable electromagnetic carrier signals including infrared signals. In embodiments, the item 530 may be used to perform one or more process steps in FIG. 1.

In the illustrated system, all major system components may connect to a bus 516, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A flight system including a diagnostic modeling evaluator for iteratively repairing a diagnostic unit that includes a diagnostic matrix of the flight system, comprising:

one or more processors;

a plurality of sensors coupled to the one or more processors; and a memory that is communicatively coupled to the one or more processors and stores one or more sequences of instructions, in which execution of the one or more sequences of instructions by at least one of the one or more processors causes the diagnostic modeling evaluator to perform the steps comprising:

evaluating a first diagnostic performance of the diagnostic unit using supervised data that is generated by the plurality of sensors and includes one or more instances of a fault of the flight system;

proposing a repair to the diagnostic unit based on the first diagnostic performance;

evaluating a second diagnostic performance of the diagnostic unit having the proposed repair; and performing the repair to the diagnostic unit based on the proposed repair.

2. A flight system as recited in claim 1, wherein the step of evaluating a first diagnostic performance of the diagnostic unit using supervised data includes;

determining a number of instances correctly detected among the one or more instances by a test and a total number of the one or more instances;

calculating a ratio between the determined number of instances and the total number; and checking whether the calculated ratio meets a preset criterion.

3. A flight system as recited in claim 2, wherein the step of determining a number of instances correctly detected among the one or more instances by a test and a total number of the one or more instances is performed when an element of the diagnostic matrix corresponding to the fault and the test is 0.

4. A flight system as recited in claim 2, wherein the step of determining a number of instances correctly detected among the one or more instances by a test and a total number of the one or more instances is performed when an element of the diagnostic matrix corresponding to the fault and the test is 1.

5. A flight system as recited in claim 1, wherein the step of evaluating a first diagnostic performance of the diagnostic unit using supervised data includes;

isolating a portion of the one or more instances;

calculating a ratio of numbers between isolated portion and an entire portion of the one or more instances; and checking whether the calculated ratio meets a preset criterion.

6. A flight system as recited in claim 5, wherein the step of calculating a ratio of numbers includes;

calculating a ratio of numbers between the isolated portion when a true fault is not the fault and an entire portion of the one or more instances.

7. A flight system as recited in claim 5, wherein the step of calculating a ratio of numbers includes;

calculating a ratio of numbers between the isolated portion when a true fault is the fault and an entire portion of the one or more instances.

8. A flight system as recited in claim 1, the execution of one or more sequences of instructions by at least one of the one or more processors causes the diagnostic modeling evaluator to perform the additional step of;

calculating an element (i,j) of a confusion matrix, where the element (i,j) represents how many instances of fault i are isolated as fault j.

9. A flight system as recited in claim 1, wherein the proposed repair includes at least one of (1) addressing a duplicity of row or column of the diagnostic matrix, (2) adding or removing a row of the diagnostic matrix, (3) changing a logic for detecting the one or more instances, (4) changing an element of the diagnostic matrix, and (5) adding or removing adding or removing a column of the diagnostic matrix.

10. A flight system as recited in claim 9, wherein the step of proposing a repair is based on an overall utility function, wherein the overall utility function includes diagnostic measures and a cost for the repair.

11. A flight system as recited in claim 9, the execution of one or more sequences of instructions by at least one of the one or more processors causes the diagnostic modeling evaluator to perform the additional step of:

providing a diagnostic matrix repair mechanism where a suite of repair strategies can each provide a recommendation for the diagnostic matrix.

12. A flight system as recited in claim 9, further comprising:

an infrastructure, wherein the repair utilizes the infrastructure which performs the steps of (1) evaluating diagnostic measures over required supervised data cases, (2) mapping the diagnostic measures to a suggested diagnostic matrix repair, (3) determining whether to perform repair immediately or to differ to a prescribed point in time, (4) accumulating diagnostic matrix repair suggestions, (5) presenting a proposed repair to user, (6) recording a user decision of accept/decline for a proposed diagnostic matrix repair, and (7) performing the proposed diagnostic matrix repair responsive to the user decision of accept for the proposed diagnostic matrix repair.

13. A flight system as recited in claim 12, wherein the infrastructure instantiates, the proposed diagnostic matrix repair, responsive to the user decision of accept for the proposed diagnostic matrix repair.

14. A computer-implemented method for repairing a diagnostic unit having a diagnostic matrix of a flight system, comprising:

calculating diagnostic measures for a fault in supervised data of the flight system, the supervised data being generated by a plurality of sensors of the flight system and including one or more instances of the fault;

copying the diagnostic unit to save an unrepaired state of the diagnostic unit before repair;

repairing the diagnostic unit based on the calculated diagnostic measures;

evaluating diagnostic performance of the repaired diagnostic unit; and upon determining that the diagnostic performance meets a performance metric criterion, propagating the repairing back to a system model.

15. A computer-implemented method as recited in claim 14, wherein the diagnostic measures include a detection measure matrix and wherein an element of the detection matrix is a ratio between a number of instances correctly detected among the one or more instances by a test and a total number of the one or more instances.

16. A computer-implemented method as recited in claim 14, wherein the diagnostic measures include a false positive detection measure matrix and wherein an element of the false positive detection matrix is a ratio between a number of instances correctly detected among the one or more instances by a test and a total number of the one or more instances when an element of the diagnostic matrix corresponding to the fault and the test is 0.

17. A computer-implemented method as recited in claim 14, wherein the diagnostic measures include a false negative detection measure matrix and wherein an element of the false negative detection matrix is a ratio between a number of instances correctly detected among the one or more instances by a test and a total number of the one or more instances when an element of the diagnostic matrix corresponding to the fault and the test is 1.

18. A computer-implemented method as recited in claim 14, wherein the diagnostic measures include an isolability measure and wherein the isolability measure is a ratio between a number of correctly isolated instances among the one or more instances and a total number of the one or more instances.

19. A computer-implemented method as recited in claim 14, wherein the diagnostic measures include a false positive isolability measure and the false positive isolability measure is a ratio between a number of correctly isolated instances among the one or more instances when a true fault is not the fault and a total number of the one or more instances.

20. A computer-implemented method as recited in claim 14, wherein the diagnostic measures include a false negative isolability measure and the false negative isolability measure is a ratio between a number of correctly isolated instances among the one or more instances when a true fault is the fault and a total number of the one or more instances.

21. A computer-implemented method as recited in claim 14, the diagnostic measures include a confusion matrix and wherein an element (i,j) of a confusion matrix represents how many instances of fault i are isolated as fault j.

22. A computer-implemented method as recited in claim 14, wherein the step of repairing diagnostic unit includes at least one of (1) addressing a duplicity of row or column of the diagnostic matrix, (2) adding or removing a row of the diagnostic matrix, (3) changing a logic for detecting the one or more instances, (4) changing an element of the diagnostic matrix, and (5) adding or removing adding or removing a column of the diagnostic matrix.

23. A computer-implemented method as recited in claim 14, further comprising: proposing a repair based on an overall utility function, wherein the overall utility function includes diagnostic measures and a cost for the proposed repair.

* * * * *